United States Patent
Aiba

(10) Patent No.: US 8,101,288 B2
(45) Date of Patent: Jan. 24, 2012

(54) GAS BARRIER FILM AND ORGANIC DEVICE USING THE SAME

(75) Inventor: Satoshi Aiba, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 897 days.

(21) Appl. No.: 12/136,430

(22) Filed: Jun. 10, 2008

(65) Prior Publication Data

US 2008/0305359 A1 Dec. 11, 2008

(30) Foreign Application Priority Data

Jun. 11, 2007 (JP) ................................. 2007-154373
Apr. 16, 2008 (JP) ................................. 2008-106853

(51) Int. Cl.
*H01J 1/63* (2006.01)

(52) U.S. Cl. ..... 428/689; 428/1.32; 428/1.51; 428/1.52; 428/500

(58) Field of Classification Search .................. None
See application file for complete search history.

(56) References Cited

U.S. PATENT DOCUMENTS

| | | | |
|---|---|---|---|
| 6,211,262 B1 | 4/2001 | Mejiritski et al. | |
| 7,601,427 B2 * | 10/2009 | Kato et al. | 428/447 |
| 7,955,700 B2 * | 6/2011 | Agata | 428/411.1 |
| 2002/0037428 A1 | 3/2002 | Koch | |

FOREIGN PATENT DOCUMENTS

| | | |
|---|---|---|
| EP | 0752612 A1 | 1/1997 |
| EP | 1839847 A1 | 10/2007 |

OTHER PUBLICATIONS

English language abstract of JP-2006-160941-A (Denki Kagaku Kogyo KK), Jun. 22, 2006, Database WPI Week 200647, Thomson Scientific, London, Great Britain, XP-002516234.

English language abstract of JP-2003-053881-A (Sumitomo Bakelite Co., Ltd), Feb. 26, 2003, Database WPI Week 200377, Thomson Scientific, London, Great Britain, XP-002516235.

* cited by examiner

*Primary Examiner* — John J Figueroa
(74) *Attorney, Agent, or Firm* — Birch, Stewart, Kolasch & Birch, LLP

(57) ABSTRACT

A gas barrier film having a gas barrier layer and an antistatic layer containing an acrylic or methacrylic resin obtained by copolymerizing a monomer represented by the formula (1) or an oligomer thereof:

$$(Ac^1-L^1)_m-M-(L^2-Ac^2)_n \qquad \text{Formula (1)}$$

wherein $Ac^1$ and $Ac^2$ represent a (meth)acryloyl group; $L^1$ and $L^2$ represent an alkylene group, an arylene group, etc.; M represents a metal atom; m and n are an integer of 0-6; and the total sum of m and n is 1-6. The gas barrier film has high barrier properties.

10 Claims, No Drawings

GAS BARRIER FILM AND ORGANIC DEVICE USING THE SAME

BACKGROUND OF THE INVENTION

1. Field of the Invention

The present invention relates to a film with excellent gas barrier properties and an organic device using the same, particularly a laminated gas barrier film which is suitable for substrates or covering films of various organic devices. Furthermore, the invention relates to an organic device with excellent durability and flexibility using the foregoing gas barrier film, particularly an organic EL device.

2. Description of the Related Art

In recent years, in organic devices such as liquid crystal display devices, solar cells and electroluminescent (EL) devices, the use of a transparent plastic film which is thin, light and excellent in flexibility in place of a glass substrate which is heavy and easy to break is being studied. In view of the matters that transparent plastic substrates are easy to realize a large area and able to be applied for a roll-to-roll production system, they are good in productivity as compared with glasses and advantageous on the point of a cost reduction.

However, the transparent plastic substrates involve a problem that they are inferior in gas barrier properties to glasses. In organic devices, in general, constitutional materials are easy to cause deterioration or change of properties by water or air. For example, when a base material with inferior gas barrier properties is used for a substrate of liquid crystal display device, it deteriorates a liquid crystal in a liquid crystal cell, and a deterioration site becomes a display defect, thereby reducing the display grade.

In order to solve these problems, a gas barrier function may be imparted to the foregoing plastic film substrate per se, or the whole of the device may be sealed by a transparent plastic film with gas barrier properties. As a gas barrier film, films having a metal oxide thin film formed on a plastic film are generally known. As a gas barrier film to be used for liquid crystal display devices, for example, there are films having silicon oxide vapor deposited on a plastic film (see, for example, JP-B-53-12953 (pages 1 to 3)) and films having aluminum oxide vapor deposited on a plastic film (see, for example, JP-A-58-217344 (pages 1 to 4)). All of these films have water vapor barrier properties to an extent that their water vapor permeability is about 1 g/m²/day. However, in recent years, the development of organic EL displays or high-definition color liquid crystal displays which are required to have higher barrier properties is being advanced, and base materials capable of being used therefor and keeping transparency and having high barrier properties and in particular, those having water vapor barrier properties and having performance such that a water vapor permeability thereof is less than 0.1 g/m²/day are being required.

In order to respond to these requirements, as a measure capable of being expected to have higher barrier performance, the fabrication by a sputtering method or CVD method for forming a thin film using plasma emitted by glow discharge under a low-pressure condition is studied. Also, there is proposed a technology for preparing a barrier film having an organic layer/inorganic layer alternate laminated structure by a vacuum vapor deposition method (see, for example, U.S. Pat. No. 6,413,645B1 (page 4, [2-54] to page 8, [8-22])).

In fabricating both an organic layer and an inorganic layer, in order to obtain high barrier properties, it is important that foreign matters such as dusts are not mixed as far as possible. Technical disclosures regarding barrier films having an antistatic layer have been made until now. However, these were aimed to give an antistatic layer after forming a barrier layer, thereby preventing handling or dust attachment on a finished film (see, for example, JP-A-2005-305801 (pages 1 to 11)). Also, there are an example of a gas barrier film in which a barrier layer is formed using an antistatic film having a conductive fine particle mixed therein (see, for example, JP-A-2002-137323 (pages 1 to 7)); and an example of a barrier film in which a coating material having a conductive fine particle mixed therein is coated on a substrate film, and a barrier layer is provided on the opposite side to the coated surface (see, for example, JP-A-8-294991 (pages 1 to 12) and JP-A-2006-88538 (pages 1 to 38)). However, in the former, when the fine particle is mixed in the substrate film, the smoothness of the film surface becomes worse, and as a result, the barrier properties are not so high. Also, in the latter, there is pointed out a problem that the formation of the barrier layer is limited to one surface, and the mixed conductive fine particle peels off, thereby affecting the fabrication of the barrier layer. On the other hand, though a method of using an acrylic ester having a quaternary ammonium salt is also disclosed, the antistatic properties in vacuum are deteriorated, whereby the resultant is no longer useful (see, for example, JP-A-10-58621 (pages 1 to 8)). Also, though a method of using an ITO thin film in which an antistatic layer is formed by a sputtering method or polyaniline or the like is disclosed, this method is not so preferable from the standpoint of costs (see, for example, JP-A-2001-246688 (pages 1 to 6) and JP-A-11-28780 (pages 1 to 9)). The formation of an antistatic layer capable of solving these various problems and being used for the fabrication of a barrier film has been desired.

SUMMARY OF THE INVENTION

The invention is aimed to solve the foregoing various problems and to provide a flexible gas barrier film exhibiting high barrier properties and capable of being transparent. Furthermore, the invention is aimed to provide an organic device which when used over a long period of time, is hardly deteriorated (for example, organic EL devices and dye-sensitized solar cells) by using this film.

The foregoing problems can be solved by the following measures.

[1] A gas barrier film comprising an antistatic layer and a gas barrier layer on a flexible supporting substrate, wherein the gas barrier layer comprises at least one inorganic layer, and the antistatic layer comprises an acrylic or methacrylic resin obtained by copolymerizing a monomer represented by the following formula (1) or an oligomer thereof:

$(Ac^1-L^1)_m-M-(L^2-Ac^2)$ Formula (1)

wherein $Ac^1$ and $Ac^2$ each independently represents an acryloyl group or a methacryloyl group; $L^1$ and $L^2$ each independently represents a substituted or unsubstituted alkylene group having from 1 to 18 carbon atoms, a substituted or unsubstituted arylene having from 6 to 18 carbon atoms, an ether group, an imino group, a carbonyl group or a divalent connecting group in which two or more of these groups are bonded in series; M represents a metal atom; m and n each independently represents an integer of from 0 to 6; and the total sum of m and n is from 1 to 6.

[2] The gas barrier film as set forth in [1], wherein the antistatic layer comprises an acrylic or methacrylic resin obtained by copolymerizing a monomer represented by the formula (1) or an oligomer thereof in an amount of from 1 to 80% by weight relative to the other acrylate or methacrylate monomer.

[3] The gas barrier film as set forth in [1] or [2], wherein M in the formula (1) is a zinc atom, an aluminum atom, an indium atom or a tin atom.

[4] The gas barrier film as set forth in any one of [1] to [3], wherein the antistatic layer has a surface resistivity of not more than $1\times10^{11}\Omega/\square$ in an atmosphere at 25° C. and at a relative humidity of 60%.

[5] The gas barrier film as set forth in any one of [1] to [4], wherein the antistatic layer has a thickness of from 0.2 to 5 μm.

[6] The gas barrier film as set forth in any one of [1] to [5], further comprising at least one organic layer.

[7] The gas barrier film as set forth in [6], wherein the organic layer comprises, as a major component, a polymer obtained from an acrylate monomer, a methacrylate monomer or a mixture thereof.

[8] An organic device sealed by the gas barrier film as set forth in any one of [1] to [7].

[9] An electroluminescent device comprising the gas barrier film as set forth in any one of [1] to [7].

[10] An electroluminescent device sealed by the gas barrier film as set forth in any one of [1] to [7].

According to the invention, a flexible gas barrier film with high barrier properties can be provided. Also, according to the invention, it is possible to provide a gas barrier film with transparency. Furthermore, according to the invention, an organic device with excellent wet heat durability can be provided.

BEST MODE FOR CARRYING OUT THE INVENTION

The gas barrier film and the organic device of the invention are hereunder described in detail. The following description of the constitutional requirements is made on the basis of representative embodiments of the invention, but it should not be construed that the invention is limited to those embodiments. In this specification, numerical value ranges expressed by the term "to" mean that the numerical values described before and after it are included as a lower limit and an upper limit, respectively.

<<Gas Barrier Film>>

(Configuration of Gas Barrier Film)

The gas barrier film of the invention has an antistatic layer and a gas barrier layer including at least one inorganic layer on a flexible supporting substrate. The gas barrier film of the invention may be configured to have a gas barrier layer on one surface of a flexible supporting substrate or may be configured to have a gas barrier layer on the both surfaces of a flexible supporting substrate. In the case where the gas barrier film of the invention has a gas barrier layer on the both surfaces of a flexible supporting substrate, the gas barrier layer to be formed on each surface may be the same or different. Also, the gas barrier film of the invention may have the antistatic layer and the gas barrier layer on the same surface of the flexible supporting substrate, or may have the antistatic layer on one surface of the flexible supporting substrate and have the gas barrier layer on the other surface of the flexible supporting substrate. In the case where the gas barrier film of the invention has an antistatic layer and a gas barrier layer on the same surface of a flexible supporting substrate, it is preferable that the antistatic layer is provided between the flexible supporting substrate and the gas barrier layer.

(Plastic Film)

In the gas barrier film of the invention, a plastic film is in general used as the flexible supporting substrate. The plastic film to be used is not particularly limited with respect to the material quality and thickness, etc. so far as it is a film capable of keeping a laminate of an organic layer, an inorganic layer and the like and can be properly chosen depending upon the use purpose or the like. Specific examples of the plastic film include metal supports (for example, aluminum, copper and stainless steel); and thermoplastic resins such as polyester resins, methacrylic resins, methacrylic acid-maleic acid copolymers, polystyrene resins, transparent fluorocarbon resins, polyimides, fluorinated polyimide resins, polyamide resins, polyamide-imide resins, polyetherimide resins, cellulose acylate resins, polyurethane resins, polyetheretherketone resins, polycarbonate resins, alicyclic polyolefin resins, polyarylate resins, polyethersulfone resins, polysulfone resins, cycloolefin copolymers, fluorene ring-modified polycarbonate resins, alicyclic modified polycarbonate resins, fluorene ring-modified polyester resins and acryloylated compounds.

In the case where the gas barrier film of the invention is used as a substrate of a device such as organic EL devices as described later, it is preferable that the plastic film is composed of a raw material with heat resistance. Specifically, it is preferable that the plastic film is composed of a transparent raw material with high heat resistance having a glass transition temperature (Tg) of 100° C. or higher and/or a linear heat expansion coefficient of not more than 40 ppm/° C. The Tg and linear heat expansion coefficient can be adjusted by an additive or the like. Examples of such a thermoplastic resin include polyethylene naphthalate (PEN: 120° C.), polycarbonate (PC: 140° C.), alicyclic polyolefins (for example, ZEONOR 1600, manufactured by Zeon Corporation: 160° C.), polyarylate (PAr: 210° C.), polyethersulfone (PES: 220° C.), polysulfone (PSF: 190° C.), cycloolefin copolymers (COC: a compound described in Example 1 of JP-A-2001-150584: 162° C.), polyimides (for example, NEOPULIM, manufactured by Mitsubishi Gas Chemical Company, Inc.: 260° C.), fluorene ring-modified polycarbonate (BCF-PC, a compound described in JP-A-2000-227603: 225° C.), alicyclic modified polycarbonate (IP-PC, a compound described in JP-A-2000-227603: 205° C.) and acryloyl compound (a compound described in JP-A-2002-80616: 300° C. or higher) (the numerical figure in each of the parentheses indicates Tg). In particular, in the case where the transparency is required, it is preferable to use an alicyclic polyolefin or the like.

In the case where the gas barrier film of the invention is used in combination with a polarizing plate, it is preferable that the gas barrier layer surface of the gas barrier film (surface on which the laminate including at least one inorganic layer and at least one organic layer is formed) is faced at the inside of a cell and is disposed in the innermost (adjacent to the device). At that time, since the gas barrier film is disposed in the inside of the cell relative to the polarizing plate, a retardation value of the gas barrier film is important. As to a use form of the gas barrier film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas barrier film using a base material film having a retardation value of from 100 nm to 180 nm, which can be used as a quarter-wave plate, and used.

Examples of the base material film having a retardation of not more than 10 nm include cellulose triacetate (FUJITAC, manufactured by Fujifilm Corporation), polycarbonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

In view of the matter that the gas barrier film of the invention is utilized as a device such as organic EL devices, the plastic film must be transparent, namely its light transmittance is usually 80% or more, preferably 85% or more, and more preferably 90% or more. The light transmittance can be measured by a method described in JIS-K7105, namely by measuring a total light transmittance and an amount of scattered light using an integrating sphere type light transmittance analyzer and subtracting the diffuse transmittance from the total light transmittance.

Even in the case where the gas barrier film of the invention is used for display use, for example, when it is not disposed on the side of an observer, the transparency is not always required. Accordingly, in such case, an opaque material can also be used as the plastic film. Examples of the opaque material include known liquid crystal polymers such as polyimides and polyacrylonitrile.

The thickness of the plastic film to be used for the gas barrier film of the invention is properly chosen depending upon the use and therefore, is not particularly limited. It is typically from 1 to 800 μm, and preferably from 10 to 200 μm. These plastic films may have a functional layer such as a transparent conductive layer and a primer layer. The functional layer is described in detail in paragraphs 0036 to 0038 of JP-A-2006-289627. Examples of functional layers other than these layers include a matting agent layer, a passivation layer, a smoothening layer, an adhesion improving layer, a light shielding layer, an antireflection layer, a hard coat layer, a stress relaxing layer, an antifogging layer, an antifouling layer, a layer to be printed and an easily adhesive layer.

(Configuration of Gas Barrier Layer)

The gas barrier layer which configures the gas barrier film of the invention has at least one inorganic layer. Preferably, the gas barrier layer has at least one inorganic layer and at least one organic layer. More preferably, the gas barrier layer is of a configuration in which an organic layer and an inorganic layer are alternately laminated; and an inorganic layer and an organic layer may be laminated in order or an organic layer and an inorganic layer may be laminated in order from the side of the flexible supporting substrate. The uppermost layer of the gas barrier layer may be an inorganic layer or an organic layer.

(Inorganic Layer)

In the invention, the inorganic layer is usually a thin film layer having a minute structure capable of suppressing the permeation of a gas molecule constituted of an inorganic material, and examples thereof include thin films composed of a metal compound (metal compound thin film).

As to the formation of the inorganic layer, any method is employable so far as it is a method capable of forming a desired thin film. As the formation method, for example, a sputtering method, a vacuum vapor deposition method, an ion plating method and a plasma CVD method are favorable. Specifically, formation methods described in, for example, Japanese Patent No. 3400324, JP-A-2002-322561 and JP-A-2002-361774 are employable.

A component constituting the inorganic layer is not particularly limited so far as it complies with the foregoing performance. For example, oxides, nitrides or oxynitrides containing at least one metal selected from the group consisting of Si, Al, In, Sn, Zn, Ti, Cu, Ce and Ta, and preferably at least one metal selected from the group consisting of Si, Al, In, Sn, Ti and Zn can be used. In the invention, preferable are silicon oxide, aluminum oxide, and mixed oxide of silicon and aluminum. By utilizing these preferable oxides, the adhesion between the organic layer and the inorganic layer can be enhanced more.

Since the inorganic layer is a thin film having a minute structure capable of suppressing the permeation of a gas molecule, a film density of the thin film is preferably in the range of from 2.1 g/cm$^3$ to 7.0 g/cm$^3$, more preferably in the range of from 2.1 g/cm$^3$ to 6.0 g/cm$^3$, and further preferably in the range of from 2.6 g/cm$^3$ to 6.0 g/cm$^3$. The film density of the thin film can be, for example, calculated through the measurement of an X-ray reflectance of a thin film formed on an Si wafer.

Also, the thickness of the inorganic layer is not particularly limited. However, in the case where the thickness is too thick, there is a possibility that a crack is formed due to a flexural stress, whereas in the case where it is too thin, the film is distributed in an island state; and therefore, in all of these cases, the gas barrier properties tend to become worse. For that reason, the thickness of each inorganic layer is preferably in the range of from 5 nm to 1,000 nm, more preferably in the range of from 10 nm to 1,000 nm, and most preferably in the range of from 10 nm to 200 nm.

In the invention, in order to make gas barrier properties and high transparency compatible with each other, it is preferable to use a silicon oxide, a silicon nitride or a silicon oxynitride as the inorganic layer. In the case where $SiO_x$ which is a silicon oxide is used as the inorganic layer, in order to make good gas barrier properties and high light transmittance compatible with each other, the relationship of $(1.6<x<1.9)$ is desirable. In the case where $SiN_y$ which is a silicon nitride is used as the inorganic layer, the relationship of $(1.2<y<1.3)$ is desirable. When y is less than 1.2, the coloration may possibly become large, leading to restrictions in the case of using for display use.

Also, in the case where $SiO_xN_y$ which is a silicon oxynitride is used as the inorganic layer, when enhancement of the adhesion is regarded as important, an oxygen-rich film is preferable, and specifically, it is preferable that the relationships of $(1<x<2)$ and $(0<y<1)$ are satisfied. On the other hand, when enhancement of the gas barrier properties is regarded as important, a nitrogen-rich film is preferable, and specifically, it is preferable that the relationships of $(0<x<0.8)$ and $(0.8<y<1.3)$ are satisfied.

(Organic Layer)

In the invention, the organic layer is preferably a layer containing, as a major component, a polymer obtained from an acrylate monomer, a methacrylate monomer or a mixture thereof. It is meant by the terms "containing, as a major component, a polymer" that a proportion of the "polymer" occupied in the whole of the organic layer is 80% by mass or more. The proportion of the polymer occupied in the whole of the organic layer is preferably 90% by mass or more. The organic layer may contain other polymers as the component of not more than 20% by mass.

Examples of other polymers include polyesters, methacrylic acid-maleic acid copolymers, polystyrenes, transparent fluorocarbon resins, polyimides, fluorinated polyimides, polyamides, polyamide-imides, polyetherimides, cellulose acylates, polyurethanes, polyetherketones, polycarbonates, alicyclic polyolefins, polyarylates, polyethersulfones, polysulfones, fluorene ring-modified polycarbonates, alicyclic modified polycarbonates and fluorene ring-modified polyesters.

The polymer used in the invention may be obtained by polymerizing a monomer mixture. In the invention, the monomer mixture is preferably a mixture of from 75 to 95% by mass of a bifunctional or trifunctional acrylate or methacrylate (principal monomer) and from 5 to 25% by mass of a tetrafunctional or polyfunctional acrylate or methacrylate monomer (polyfunctional monomer). The monomer mixture may contain up to 20% by mass of a monofunctional acrylate or methacrylate monomer (monofunctional monomer).

In the invention, each of the principal monomer and the polyfunctional monomer may be a single compound or a mixture of two or more kinds of compounds. When a monofunctional monomer is contained, the monofunctional monomer may be a single compound or a mixture of two or more kinds of compounds.

The principal monomer which is preferably used in the invention is a monomer represented by the following formula (2).

(Ac—O)$_n$-L            Formula (2)

In the formula, Ac represents an acryloyl group or a methacryloyl group; L represents an n-valent connecting group having from 3 to 18 carbon atoms in total; and $\underline{n}$ represents 2 or 3.

When $\underline{n}$ is 2, then L represents a divalent connecting group having from 3 to 18 carbon atoms. Examples of the divalent connecting group having from 3 to 18 carbon atoms represented by L include an alkylene group (for example, a 1,3-propylene group, a 2,2-dimethyl-1,3-propylene group, a 2-butyl-2-ethyl-1,3-propylene group, 1,6-hexylene group, a 1,9-nonylene group, a 1,12-dodecylene group and a 1,16-hexadecylene group), an ether group, an imino group, a carbonyl group and a divalent connecting group in which a plurality of these groups are bonded in series (for example, a polyethyleneoxy group, a polypropyleneoxy group, a propionyloxyethylene group, a butyroyloxypropylene group, a caproyloxyethylene group and a caproyloxybutylene group).

When $\underline{n}$ is 3, then L represents a trivalent connecting group having from 3 to 18 carbon atoms. Examples of the trivalent connecting group having from 3 to 18 carbon atoms represented by L include trivalent residues obtained by eliminating one arbitrary hydrogen atom from the foregoing divalent connecting groups; and trivalent residues obtained by eliminating one arbitrary hydrogen atom from the foregoing divalent connecting groups and substituting thereon an alkylene group, an ether group, a carbonyl group or a divalent group in which these groups are bonded in series.

L may have a substituent. Examples of the substituent which can be substituted on L include an alkyl group (for example, a methyl group, an ethyl group and a butyl group), an aryl group (for example, a phenyl group), an amino group (for example, an amino group, a methylamino group, a dimethylamino group and a diethylamino group), an alkoxy group (for example, a methoxy group, an ethoxy group, a butoxy group and a 2-ethylhexyloxy group), an acyl group (for example, an acetyl group, a benzoyl group, a formyl group and a pivaloyl group), an alkoxycarbonyl group (for example, a methoxycarbonyl group and an ethoxycarbonyl group), a hydroxyl group, a halogen atom (for example, a fluorine atom, a chlorine atom, a bromine atom and an iodine atom) and a cyano group. The substituent is preferably an alkyl group or an alkoxy group.

Specific examples of the principal monomer represented by the formula (2) are given below, but it should not be construed that the principal monomer represented by the formula (2) which can be used in the invention is limited thereto.

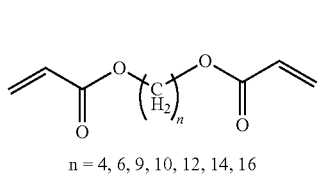

n = 4, 6, 9, 10, 12, 14, 16

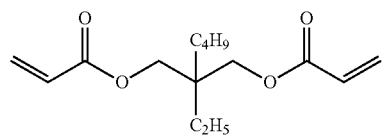

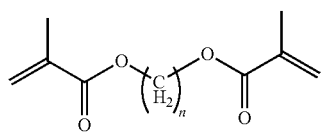

n = 4, 6, 9, 10, 12, 14, 16

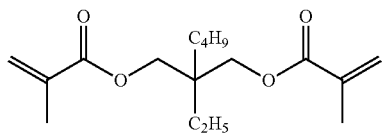

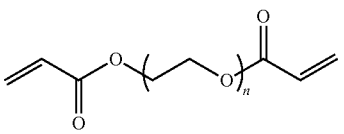

n = 2, 3, 4, 5

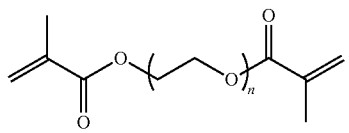

n = 2, 3, 4, 5

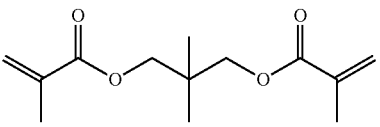

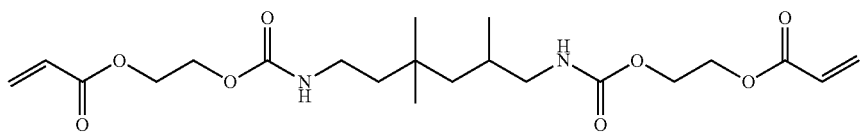

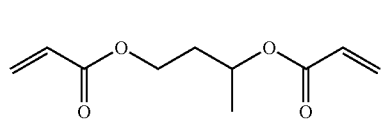
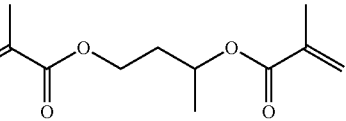
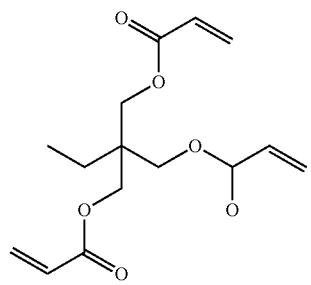
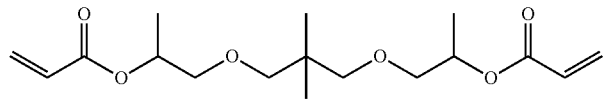
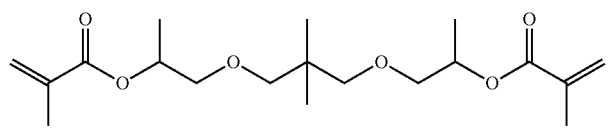
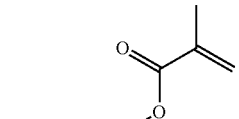
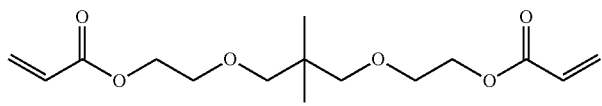
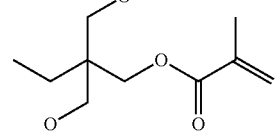
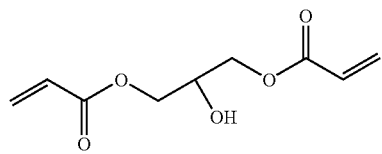
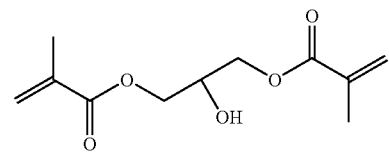
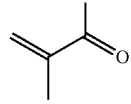
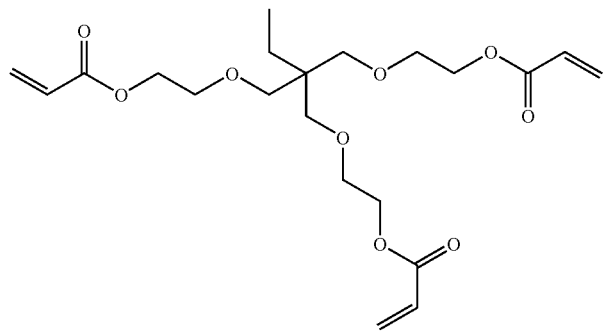
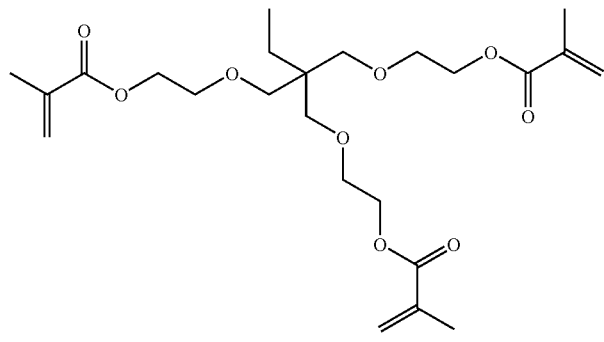

The polyfunctional monomer which can be used in the invention is not particularly limited so far as it is a tetrafunctional or polyfunctional acrylate or methacrylate monomer and is typically a tetravalent to hexavalent acrylate or methacrylate monomer. Examples of a preferable skeleton include a pentaerythritol skeleton and a dipentaerythritol skeleton.

Specific examples of the polyfunctional monomer which can be preferably used in the invention are given below, but it should not be construed that the polyfunctional monomer which can be used in the invention is limited thereto.

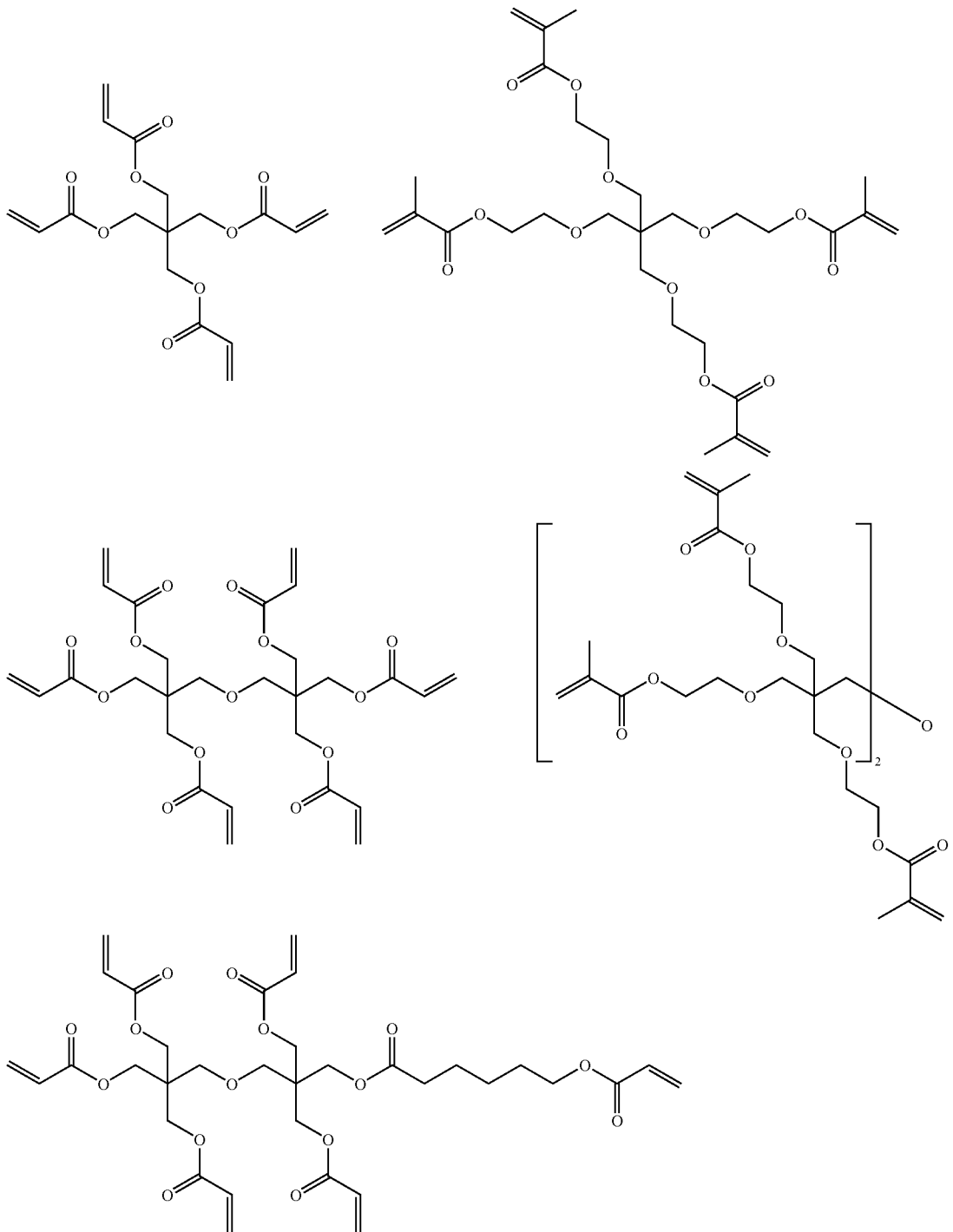

-continued
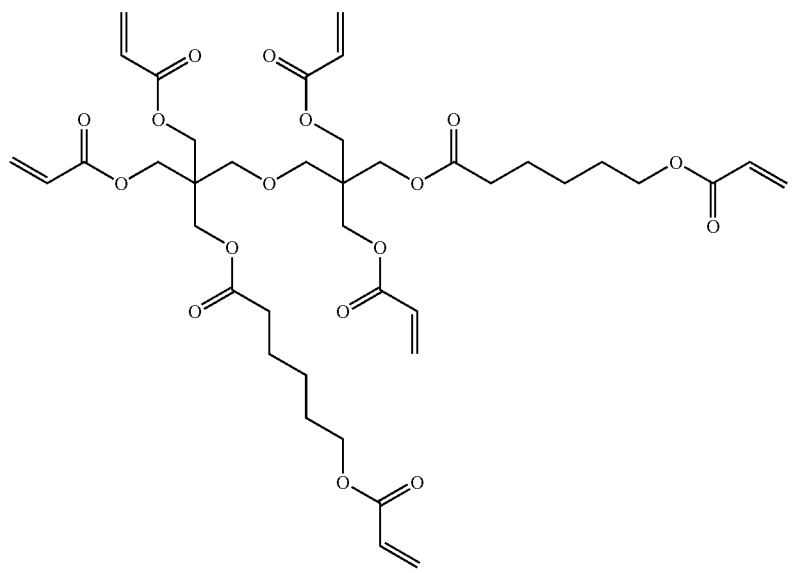
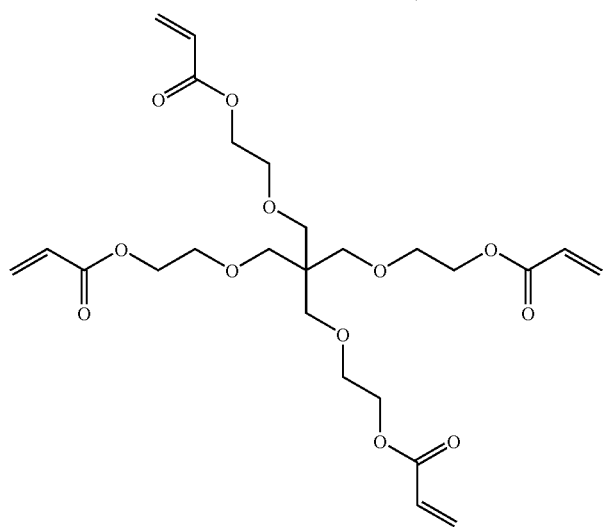
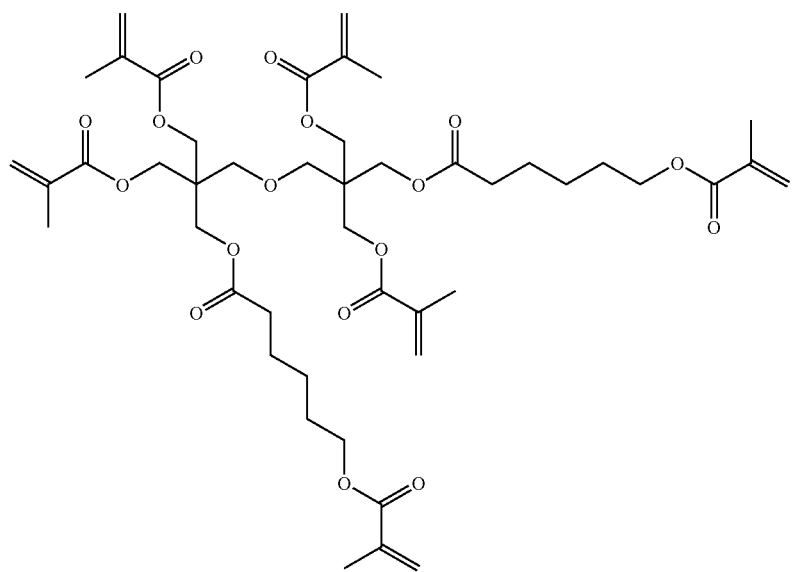

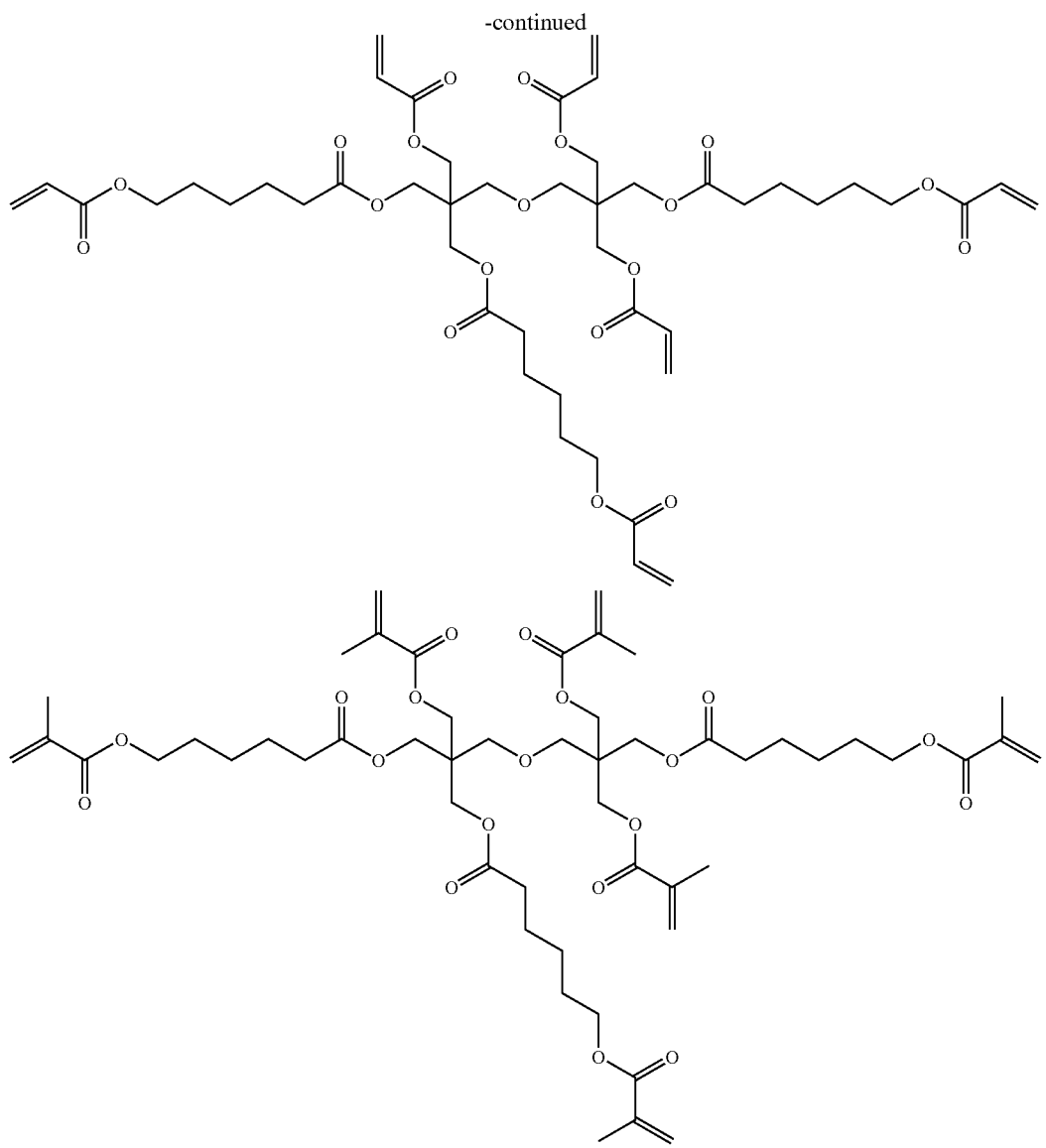

The monofunctional monomer which can be used in the invention is not particularly limited so far as it is an acrylate or methacrylate monomer and is typically an acrylate or methacrylate monomer having a molecular weight of from 150 to 600. Specific examples of the monofunctional monomer which can be used in the invention are given below, but it should not be construed that the monofunctional monomer which can be used in the invention is limited thereto.

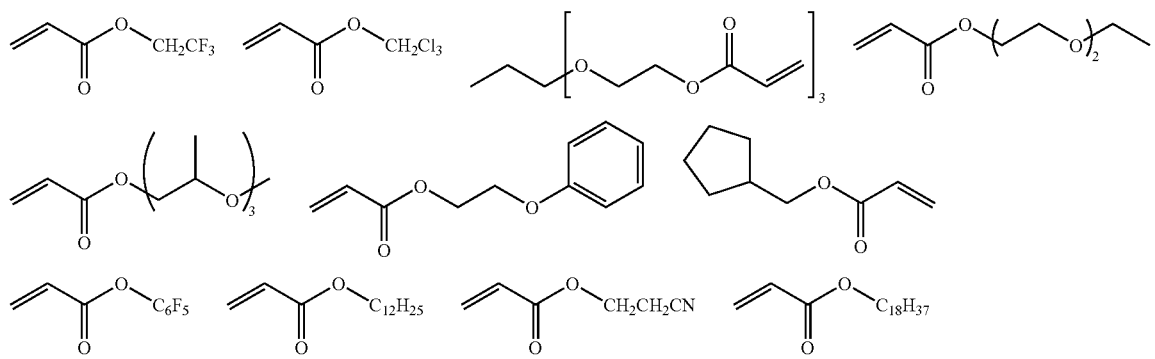

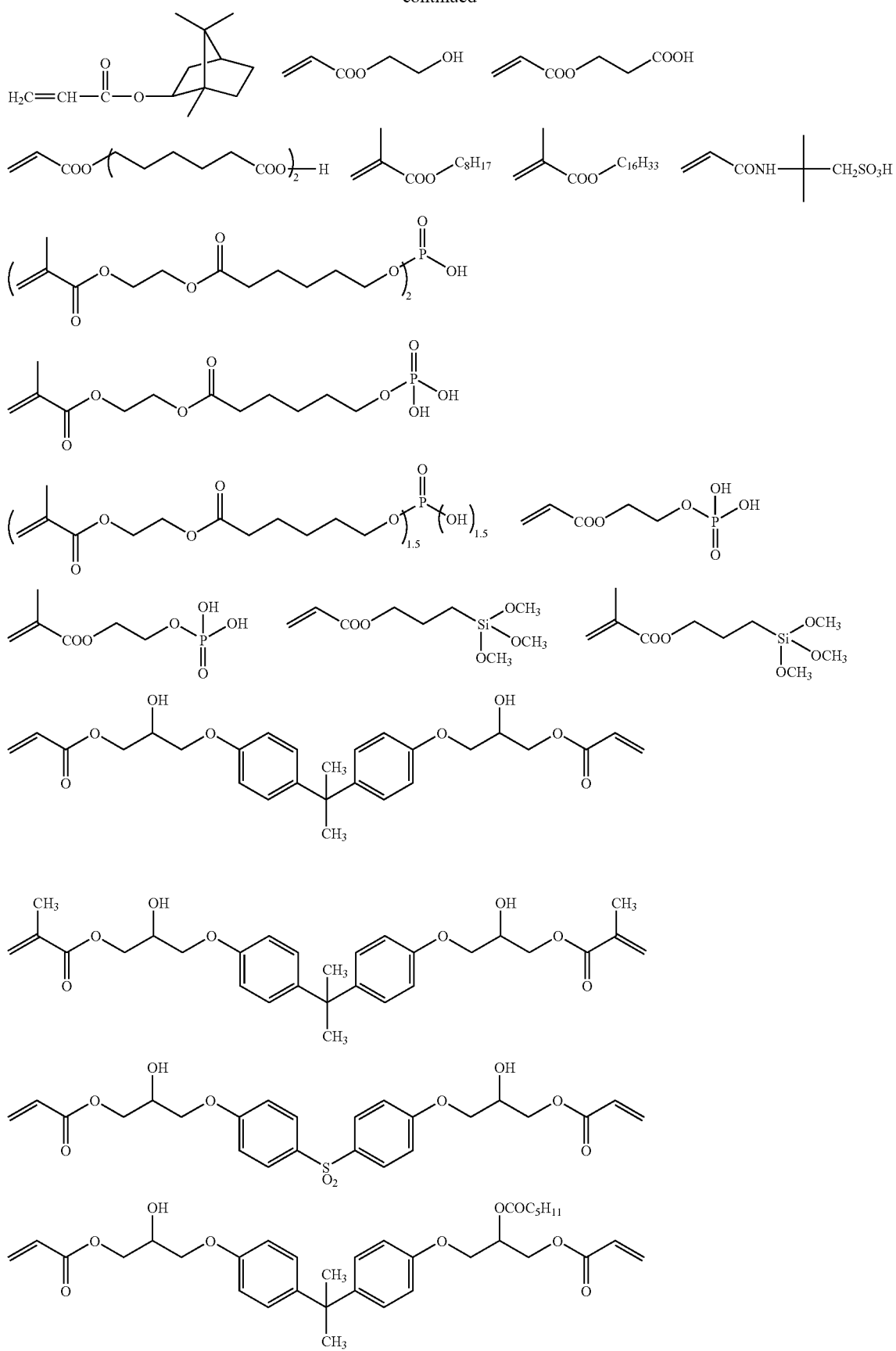

-continued

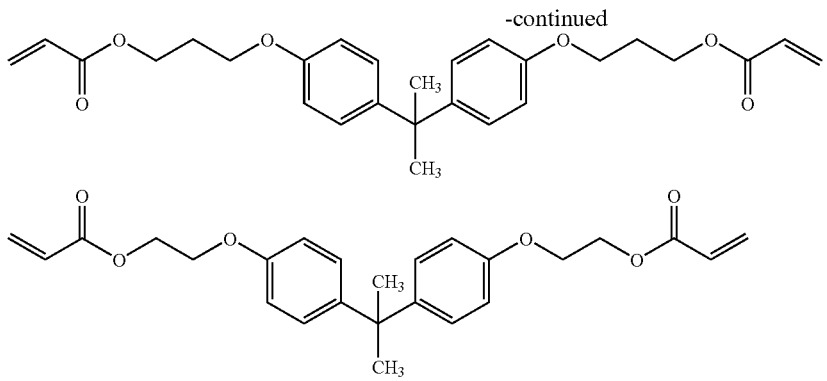

Examples of the formation method of the organic layer include usual solution coating method and vacuum fabrication method. As the solution coating method, the solution can be coated by, for example, a dip coating method, an air knife coating method, a curtain coating method, a roller coating method, a wire bar coating method, a gravure coating method, a slide coating method or an extrusion coating method using a hopper described in U.S. Pat. No. 2,681,294. Though the vacuum fabrication method is not particularly limited, a flash vapor deposition method described in U.S. Pat. Nos. 4,842,893, 4,954,371 and 5,032,461 is preferable.

Though the monomer polymerization method is not particularly limited, heat polymerization, photo (ultraviolet ray or visible light) polymerization, electron beam polymerization, plasma polymerization or a combination thereof is preferably employed. Of these, photopolymerization is especially preferable. In the case where photopolymerization is carried out, a photopolymerization initiator is used in combination. Examples of the photopolymerization initiator include IRGACURE series (for example, IRGACURE 651, IRGACURE 754, IRGACURE 184, IRGACURE 2959, IRGACURE 907, IRGACURE 369, IRGACURE 379 AND IRGACURE 819), DAROCURE series (for example, DAROCURE TPO and DAROCURE 1173) and QAUNTACURE PDO, all of which are marketed by Ciba Specialty Chemicals; and EZACURE series (for example, EZACURE TZM and EZACURE TZT) which are marketed by Sartomer Company.

The light to be irradiated is usually an ultraviolet ray to be emitted from a high pressure mercury vapor lamp or a low pressure mercury vapor lamp. The irradiation energy is preferably 0.5 J/cm² or more, and more preferably 2 J/cm² or more. Since the acrylate or methacrylate is affected by polymerization inhibition due to oxygen in air, it is preferable to reduce the oxygen concentration or oxygen partial pressure at the time of polymerization. In the case of reducing the oxygen concentration at the time of polymerization by a nitrogen purge method, the oxygen concentration is preferably not more than 2%, and more preferably not more than 0.5%. In the case of reducing the oxygen partial pressure at the time of polymerization by a pressure reducing method, the total pressure is preferably not more than 1,000 Pa, and more preferably not more than 100 Pa. Also, it is especially preferable to carry out ultraviolet ray polymerization upon irradiation with energy of 2 J/cm² or more under a reduced pressure condition of not more than 100 Pa.

The thickness of the organic layer is not particularly limited. When the thickness of the organic layer is too thin, uniformity of the thickness is hardly obtained, whereas when it is too thick, a crack is generated due to an external force, thereby causing a reduction of the barrier properties. From such a viewpoint, the thickness of the foregoing adjacent organic layer is preferably from 50 nm to 2,000 nm, and more preferably from 200 nm to 1,500 nm.

It is desirable that the thus disposed organic layer is smooth. As to the smoothness of the organic layer, its Ra value measured by AFM is preferably not more than 10 nm, more preferably not more than 5 nm, and especially preferably not more than 2 nm.

(Antistatic Layer)

The antistatic layer of the gas barrier film of the invention is constituted of an acrylic resin obtained by copolymerizing the monomer represented by the formula (1) or its oligomer or a methacrylic resin obtained by copolymerizing the monomer represented by the formula (1) or its oligomer. Since the gas barrier film of the invention has an antistatic layer constituted of an acrylic resin or methacrylic resin obtained by copolymerizing the monomer represented by the formula (1) or its oligomer, high barrier properties can be obtained. The acrylic resin or methacrylic resin to be used in the antistatic layer is not particularly limited, and for example, the acrylate or methacrylate which is preferably used in the organic layer can also be preferably used as the monomer for providing the resin of the antistatic layer. The monomer represented by the formula (1) or its oligomer is preferably used in an amount of from 1 to 80% by weight, and more preferably used in an amount of from 10 to 50% by weight relative to the acrylate monomer or methacrylate monomer other than the subject monomer.

Next, the monomer represented by the formula (1) is described in detail.

$$(Ac^1-L^1)_m-M-(L^2-Ac^2)_n \qquad \text{Formula (1)}$$

In the formula, $Ac^1$ and $Ac^2$ each independently represents an acryloyl group or a methacryloyl group; $L^1$ and $L^2$ each independently represents a substituted or unsubstituted alkylene group having from 1 to 18 carbon atoms, a substituted or unsubstituted arylene group having from 6 to 18 carbon atoms, an ether group, an imino group, a carbonyl group or a divalent connecting group in which a plurality of these groups are bonded in series; M represents a metal atom; m and n each independently represents an integer of from 0 to 6; and the total sum of m and n is from 1 to 6.

Examples of the alkylene group having from 1 to 18 carbon atoms represented by $L^1$ and $L^2$ include a methylene group, an ethylene group, a 1,3-propylene group, a 2,2-dimethyl-1,3-propylene group, a 2-butyl-2-ethyl-1,3-propylene group, a 1,6-hexylene group, a 1,9-nonylene group, a 1,12-dodecylene group and a 1,16-hexadecylene group. Examples of the arylene group having from 6 to 18 carbon atoms include a 1,4-phenylene group. Examples of the divalent connecting group in which a plurality of an alkylene group, an arylene group, an ether group, an imino group and a carbonyl group are bonded in series include a polyethyleneoxy group, a polypropyleneoxy group, a propionyloxyethylene group, a butyroyloxypropylene group, a caproyloxyethylene group and a caproyloxybutylene group.

$L^1$ and $L^2$ may each have a substituent. Examples of the substituent which can be substituted on each of $L^1$ and $L^2$ include an alkyl group (for example, a methyl group, an ethyl group and a butyl group), an aryl group (for example, a phenyl group), an amino group (for example, an amino group, a methylamino group, a dimethylamino group and a diethylamino group), an alkoxy group (for example, a methoxy group, an ethoxy group, a butoxy group and a 2-ethylhexyloxy group), an acyl group (for example, an acetyl group, a benzoyl group, a formyl group and a pivaloyl group), an alkoxycarbonyl group (for example, a methoxycarbonyl group and an ethoxycarbonyl group), a hydroxyl group, a halogen atom (for example, a fluorine atom, a chlorine atom, a bromine atom and an iodine atom) and a cyano group. The substituent is preferably an alkyl group or an alkoxy group.

M represents a metal atom, and examples thereof include a zinc atom, an aluminum atom, an indium atom and a tin atom. Of these, a zinc atom is preferable.

The total sum of m and n is from 1 to 6, preferably from 2 to 6, and more preferably from 2 to 5.

Specific examples of the monomer represented by the formula (1) are given below, but it should not be construed that the monomer represented by the formula (1) which can be used in the invention is limited thereto.

or methacrylic resin. Examples of such a component include polyesters, polystyrenes and polyurethanes. The content of such a component is preferably not more than 80% by mass, more preferably not more than 50% by mass, and further preferably not more than 30% by mass. The antistatic layer can be, for example, formed by dissolving the resin in an organic solvent and coating the solution on the flexible supporting substrate using a wire bar, etc., followed by drying.

The surface resistivity of the antistatic layer is preferably not more than $1\times10^{11}\Omega/\square$, and more preferably from $1\times10^{8}\Omega/\square$ to $5\times10^{10}\Omega/\square$ in an atmosphere at 25° C. and at a relative humidity of 60%. The antistatic layer has an effect for preventing a phenomenon in which a defect is generated in the inorganic layer due to a foreign matter such as dusts, thereby hindering the gas barrier properties from occurring. For that reason, in order to obtain much higher gas barrier properties, it is especially preferable that the antistatic layer is previously formed on the flexible supporting substrate prior to the formation of the inorganic layer. Also, the antistatic layer may be formed on any surface of the flexible supporting substrate and may be formed on only one surface or both surfaces thereof. The thickness of the antistatic layer is preferably from 0.2 to 5 µm, more preferably from 0.5 to 5 µm, and further preferably from 0.5 to 3 µm.

(Other Layers)

The gas barrier film of the invention may further have other layer than the antistatic layer and the gas barrier layer on the flexible supporting substrate. For example, a matting agent layer, a passivation layer, a smoothening layer, an adhesion improving layer, a light shielding layer, an antireflection

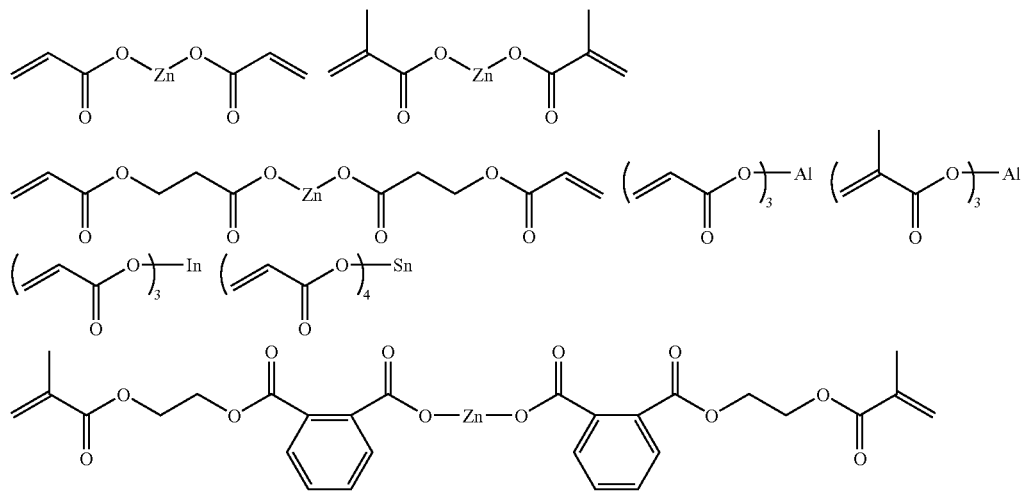

The oligomer which can be used in the invention has a structure obtained by polymerizing the monomer represented by the formula (1). In the invention, oligomers having a different repeating unit number may be combined and used, and an oligomer and a monomer may be combined and used.

The acrylic resin or methacrylic resin obtained by copolymerizing the monomer represented by the formula (1) or its oligomer can be obtained by copolymerizing the monomer represented by the formula (1) or its oligomer with an acrylate or a methacrylate according to a usual polymerization method. For example, the methods and materials described at the monomer polymerization method of the organic layer can be preferably used.

The antistatic layer of the gas barrier film of the invention may contain other component than the foregoing acrylic resin layer, a hard coat layer and the like may be properly provided. These layers can be properly provided depending upon the use purpose or use embodiment of the gas barrier film of the invention.

(Shape of Gas Barrier Film)

The shape of the gas barrier film of the invention is not limited so far as it is in a film form. For example, it may be a regular square, a rectangle, a circle or an ellipse or may be in a roll form. Also, the embodiment at the time of use is not particularly limited, and the gas barrier film of the invention may be used in a planar form or may be used in a non-planar form. Also, the gas barrier film of the invention may be in a planar form at the time of use and in a non-planar form such as a roll form at the time of shipment or storage.

<<Organic Device>>

The organic device of the invention refers to, for example, an image display device (for example, circularly polarizing plates, liquid crystal display devices, electronic papers and organic EL devices), a dye-sensitized solar cell or a touch panel. Though the use of the gas barrier film of the invention is not particularly limited, it can be favorably used as a substrate or sealing film of the organic device.

(Circularly Polarizing Plate)

The circularly polarizing plate can be prepared by laminating a λ/4 plate and a polarizing plate on the gas barrier film of the invention. In that case, the both plates are laminated in such a manner that a slow axis of the λ/4 plate and an absorption axis of the polarizing plate form 45°. As such a polarizing plate, one stretched in a direction of 45° against the machine direction (MD) thereof is preferably used, and those described in, for example, JP-A-2002-865554 can be favorably used.

(Liquid Crystal Display Device)

The liquid crystal display device can be roughly classified into a reflection type liquid crystal display device and a transmission type liquid crystal display device. The reflection type liquid crystal display device is configured to include a lower substrate, a reflection electrode, a lower alignment film, a liquid crystal layer, an upper alignment film, a transparent electrode, an upper substrate, a λ/4 plate and a polarizing film in order from the lower side. The gas barrier film of the invention can be used as the transparent electrode and the upper substrate. In the case of giving a color displaying function to the reflection type liquid crystal display device, it is preferable to further provide a color filter layer between the reflection electrode and the lower alignment film or between the upper alignment film and the transparent electrode.

Also, the transmission type liquid crystal display device is configured to include a backlight, a polarizing plate, a λ/4 plate, a lower transparent electrode, a lower alignment film, a liquid crystal layer, an upper alignment film, an upper transparent electrode, an upper substrate, a λ/4 plate and a polarizing plate in order from the lower side. Of these, the gas barrier film of the invention can be used as the upper transparent electrode and the upper substrate. Also, in the case of giving a color displaying function to the transmission type liquid crystal display device, it is preferable to further provide a color filter layer between the lower transparent electrode and the lower alignment film or between the upper alignment film and the upper transparent electrode.

Though the structure of the liquid crystal layer is not particularly limited, it is preferably of, for example, a TN (twisted nematic) type, an STN (super twisted nematic) type, an HAN (hybrid aligned nematic) type, a VA (vertically alignment) type, an ECB (electrically controlled birefringence) type, an OCB (optically compensated bend) type, a CPA (continuous pinwheel alignment) type or an IPS (in-plane switching) type.

(Touch Panel)

As the touch panel, one obtained by applying the gas barrier film of the invention onto a substrate described in, for example, JP-A-5-127822 or JP-A-2002-48913 can be used.

<Organic EL Device>

An "organic EL device" (hereafter often referred to simply as "light-emitting device") is hereunder described in detail as a representative example of the organic device of the invention.

The organic EL device of the invention has a cathode and an anode on a substrate and has an organic compound layer including an organic light-emitting layer (hereinafter often referred to simply as "light-emitting layer") between the both electrodes. In view of properties of the light-emitting device, it is preferable that at least one electrode of the anode and the cathode is transparent.

In the invention, an embodiment of the laminate of the organic compound layer is preferably an embodiment in which a hole transport layer, a light-emitting layer and an electron transport layer are laminated in order from the anode side. Furthermore, a charge blocking layer may be provided between the hole transport layer and the light-emitting layer or between the light-emitting layer and the electron transport layer. A hole injection layer may be provided between the anode and the hole transport layer; and an electron injection layer may be provided between the cathode and the electron transport layer. Each of the layers may be divided into plural secondary layers.

(Anode)

In general, the anode may have a function as an electrode capable of supplying a hole into the organic compound layer and is not particularly limited as to its shape, structure and size or the like. The anode can be properly chosen among known electrode materials depending upon the use and purpose of the light-emitting device. As described previously, the anode is usually provided as a transparent anode.

As materials of the anode, for example, metals, alloys, metal oxides, conductive compounds or mixtures thereof can be favorably exemplified. Specific examples of anode materials include conductive metal oxides such as tin oxides doped with antimony, fluorine, etc. (for example, ATO and FTO), tin oxide, zinc oxide, indium oxide, indium tin oxide (ITO) and indium zinc oxide (IZO); metals such as gold, silver, chromium and nickel; mixtures or laminates of these metals and conductive metal oxides; inorganic conductive substances such as copper iodide and copper sulfide; organic conductive materials such as polyaniline, polythiophene and polypyrrole; and laminates thereof with ITO. Of these, conductive metal oxides are preferable; and ITO is especially preferable in view of productivity, high conductivity, transparency and the like.

The anode can be formed on the substrate according to a method to be properly chosen while taking into consideration adaptability with the material constituting the anode among wet modes (for example, a printing mode and a coating mode), physical modes (for example, a vacuum vapor deposition method, a sputtering method and an ion plating method) and chemical modes (for example, CVD and plasma CVD). For example, in the case where ITO is chosen as the anode material, the anode can be formed according to a direct current or high frequency sputtering method, a vacuum vapor deposition method, an ion plating method or the like.

In the organic electroluminescent device of the invention, the position at which the anode is formed is not particularly limited and can be properly chosen depending upon the use and purpose of the light-emitting device. However, the anode is preferably formed on the substrate. In that case, the anode may be formed on the entirety of one of the surfaces of the substrate or may be formed on a part thereof. In forming the anode, patterning may be achieved through chemical etching by photolithography, etc., may be achieved through physical etching by a laser, etc., may be achieved through vacuum vapor deposition by superimposing a mask, sputtering or the like, or may be achieved by a lift-off method or a printing method. The thickness of the anode can be properly chosen depending upon the material constituting the anode and cannot be unequivocally defined. However, the thickness of the anode is in general from about 10 nm to 50 μm, and preferably from 50 nm to 20 μm.

The resistivity value of the anode is preferably not more than $10^3 \Omega/\square$, and more preferably not more than $102\Omega/\square$. In the case where the anode is transparent, it may be colorless transparent or may be colored transparent. In order to take out light emission from the transparent anode side, its transmittance is preferably 60% or more, and more preferably 70% or more. The transparent anode is described in detail in *New Developments of Transparent Conducting Films*, supervised by SAWADA, Yutaka (published by CMC Publishing Co., Ltd., 1999), and the matters described therein can be applied in the invention. In the case of using a plastic base material with low heat resistance, a transparent anode obtained through fabrication at a low temperature of not higher than 150° C. using ITO or IZO is preferable.

(Cathode)

In general, the cathode may have a function as an electrode capable of injecting an electron into the organic compound layer and is not particularly limited as to its shape, structure and size or the like. The cathode can be properly chosen among known electrode materials depending upon the use and purpose of the light-emitting device. As materials constituting the cathode, for example, metals, alloys, metal oxides, electric conductive materials or mixtures thereof can be exemplified. Specific examples thereof include alkali metals (for example, Li, Na, K and Cs), alkaline earth-metals (for example, Mg and Ca), gold, silver, lead, aluminum, a sodium-potassium alloy, a lithium-aluminum alloy, a magnesium-silver alloy, indium and rare earth metals (for example, ytterbium). Though these materials may be used singly, from the standpoint of making stability and electron injection properties compatible with each other, two or more kinds of these materials can be favorably used in combination.

Of these, in view of electron injection properties, the material constituting the cathode is preferably an alkali metal or an alkaline earth metal; and in view of excellent storage stability, the material constituting the cathode is preferably a material composed mainly of aluminum.

The material composed mainly of aluminum refers to aluminum alone or an alloy of aluminum and from 0.01 to 10% by mass of an alkali metal or an alkaline earth metal or a mixture thereof (for example, a lithium-aluminum alloy and a magnesium-aluminum alloy). The cathode material is described in detail in JP-A-2-15595 and JP-A-5-121172, and materials described in these patent documents can also be applied in the invention.

The cathode can be formed according to a known method without particular limitations. For example, the cathode can be formed according to a method to be properly chosen while taking into consideration adaptability with the material constituting the cathode among wet modes (for example, a printing mode and a coating mode), physical modes (for example, a vacuum vapor deposition method, a sputtering method and an ion plating method) and chemical modes (for example, CVD and plasma CVD). For example, in the case where a metal or the like is chosen as the cathode material, one or two or more kinds of metals can be subjected to sputtering simultaneously or successively. In forming the cathode, patterning may be achieved through chemical etching by photolithography, etc., may be achieved through physical etching by a laser, etc., may be achieved through vacuum vapor deposition by superimposing a mask, sputtering or the like, or may be achieved by a lift-off method or a printing method.

In the invention, the position at which the cathode is formed is not particularly limited, and the cathode may be formed on the entirety of the organic compound layer or may be formed on a part thereof. Also, a dielectric layer composed of a fluoride or oxide of an alkali metal or alkaline earth metal or the like may be inserted in a thickness of from 0.1 to 5 nm between the cathode and the organic compound layer. This dielectric layer can be considered as a certain kind of the electron injection layer. The dielectric layer can be formed by, for example, a vacuum vapor deposition method, a sputtering method or an ion plating method. The thickness of the cathode can be properly chosen depending upon the material constituting the cathode and cannot be unequivocally defined. However, the thickness of the cathode is in general from about 10 nm to 5 μm, and preferably from 50 nm to 1 μM.

Also, the cathode may be transparent or opaque. The transparent cathode can be formed by thinly fabricating the cathode material in a thickness of from 1 to 10 nm and further laminating a transparent conductive material such as ITO and IZO thereon.

(Organic Compound Layer)

The organic compound layer in the invention is hereunder described.

The organic electroluminescent device of the invention has at least one organic compound layer including a light-emitting layer. As described previously, examples of other organic compound layers than the organic light-emitting layer include respective layers such as a hole transport layer, an electron transport layer, a charge blocking layer, a hole injection layer and an electron injection layer.

((Formation of Organic Compound Layer))

In the organic electroluminescent device of the invention, each of the layers constituting the organic compound layer can be favorably formed by any of a dry type fabrication method (for example, a vapor deposition method and a sputtering method), a transfer method, a printing method or the like.

((Organic Light-Emitting Layer))

The organic light-emitting layer is a layer having a function such that at the time of application of an electric field, it receives a hole from the anode, the hole injection layer or the hole transport layer and receives an electron from the cathode, the electron injection layer or the electron transport layer to provide a field of recombination of the hole and the electron, thereby achieving light emission. In the invention, the light-emitting layer may be constituted of only a light-emitting material or may be configured as a mixed layer of a host material and a light-emitting material. The light-emitting material may be a fluorescent light-emitting material or a phosphorescent light-emitting material; and a dopant may be a single material or a combination of two or more kinds of materials. The host material is preferably a charge transport material. The host material may be a single material or a combination of two or more kinds of materials, and examples thereof include a constitution of a mixture of an electron transporting host material and a hole transporting host material. Furthermore, the light-emitting layer may contain a material which does not have charge transporting properties and does not emit light. Also, the light-emitting layer may be a single layer or may be configured of two or more layers, and the respective layers may emit light in a different luminescent color.

Examples of the fluorescent light-emitting material which can be used in the invention include compounds, for example, benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perynone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various metal complexes represented by metal complexes of 8-quinolinol derivatives and pyrromethene derivatives, polymer compounds (for example, polythiophene, polyphenylene and polyphenylenevinylene) and organosilane derivatives.

Also, examples of the phosphorescent light-emitting material which can be used in the invention include complexes containing a transition metal atom or a lanthanoid atom. The transition metal atom is not particularly limited, and preferred examples thereof include ruthenium, rhodium, palladium, tungsten, rhenium, osmium, iridium and platinum, with rhenium, iridium and platinum being more preferable. Examples of the lanthanoid atom include lanthanum, cerium, praseodymium, neodymium, samarium, europium, gadolinium, terbium, dysprosium, holmium, erbium, thulium, ytterbium and lutetium. Of these lanthanoid atoms, neodymium, europium and gadolinium are preferable.

Examples of a ligand of the complex include ligands described in G. Wilkinson, et al., *Comprehensive Coordination Chemistry*, published by Pergamon Press, 1987; H. Yersin, *Photochemistry and Photophysics of Coordination Compounds*, published by Springer-Verlag, 1987; and YAMAMOTO, Akio, *Organometallic Chemistry—Principles and Applications*, published by Shokabo Publishing Co., Ltd., 1982. Specifically, as the ligand, halogen ligands (preferably a chlorine ligand), nitrogen-containing heterocyclic ligands (for example, phenylpyridine, benzoquinoline, quinolinol, bipyridyl and phenanthroline), diketone ligands (for example, acetylacetone), carboxylic acid ligands (for example, an acetic acid ligand), a carbon monoxide ligand, an isonitrile ligand and a cyano ligand are preferable, with nitrogen-containing heterocyclic ligands being more preferable. The complex may contain one transition metal atom in the compound thereof or may be a so-called polynuclear complex containing two or more transition metal atoms therein. The complex may contain metal atoms of a different kind at the same time.

The phosphorescent light-emitting material is preferably contained in an amount of from 0.1 to 40% by mass, and more preferably from 0.5 to 20% by mass in the light-emitting layer. Also, examples of the host material which is contained in the light-emitting layer in the invention include materials as enumerated in the following paragraphs of hole injection layer, hole transport layer, electron injection layer and electron transport layer as well as a material having a carbazole skeleton, a material having a diarylamine skeleton, a material having a pyridine skeleton, a material having a pyrazine skeleton, a material having a triazine skeleton and a material having an arylsilane skeleton. The thickness of the light-emitting layer is not particularly limited. However, in general, the thickness of the light-emitting layer is preferably from 1 nm to 500 nm, more preferably from 5 nm to 200 nm, and further preferably from 10 nm to 100 nm.

((Hole Injection Layer and Hole Transport Layer))

The hole injection layer and the hole transport layer are each a layer having a function to receive a hole from the anode or the anode side to transport it into the cathode side. Specifically, the hole injection layer and the hole transport layer are each preferably a layer containing a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidene based compound, a porphyrin based compound, an organosilane derivative, carbon or the like. The thickness of each of the hole injection layer and the hole transport layer is preferably not more than 500 nm from the viewpoint of the reducing driving voltage.

The thickness of the hole transport layer is preferably from 1 nm to 500 nm, more preferably from 5 nm to 200 nm, and further preferably from 10 nm to 100 nm. Also, the thickness of the hole injection layer is preferably from 0.1 nm to 200 nm, more preferably from 0.5 nm to 100 nm, and further preferably from 1 nm to 100 nm. Each of the hole injection layer and the hole transport layer may be of a single-layered structure composed of one or two or more kinds of the foregoing materials or may be of a multilayered structure composed of plural layers of the same composition or a different composition.

((Electron Injection Layer and Electron Transport Layer))

The electron injection layer and the electron transport layer are each a layer having a function to receive an electron from the cathode or the cathode side to transport it into the anode side. Specifically, the electron injection layer and the electron transport layer are each preferably a layer containing a triazole derivative, an oxazole derivative, an oxadiazole derivative, an imidazole derivative, a fluorenone derivative, an anthraquinodimethane derivative, an anthrone derivative, a diphenylquinone derivative, a thiopyran dioxide derivative, a carbodiimide derivative, a fluorenylidenemethane derivative, a distyrylpyrazine derivative, aromatic ring tetracarboxylic acid anhydrides of naphthalene, perylene, etc., a phthalocyanine derivative, a metal complex of every kind represented by metal complexes of 8-quinolinol derivatives and metal complexes composed of, as a ligand, metal phthalocyanine, benzoxazole or benzothiazole, an organosilane derivative or the like.

The thickness of each of the electron injection layer and the electron transport layer is preferably not more than 500 nm from the viewpoint of reducing the driving voltage. The thickness of the electron transport layer is preferably from 1 nm to 500 nm, more preferably from 5 nm to 200 nm, and further preferably from 10 nm to 100 nm. Also, the thickness of the electron injection layer is preferably from 0.1 nm to 200 nm, more preferably from 0.2 nm to 100 nm, and further preferably from 0.5 nm to 50 nm. Each of the electron injection layer and the electron transport layer may be of a single-layered structure composed of one or two or more kinds of the foregoing materials or may be of a multilayered structure composed of plural layers of the same composition or a different composition.

((Hole Blocking Layer))

The hole blocking layer is a layer having a function to prevent a phenomenon in which the hole which has been transported into the light-emitting layer from the anode side passes through into the cathode side from occurring. In the invention, the hole blocking layer can be provided as an organic compound layer which is positioned adjacent to the light-emitting layer on the cathode side. Examples of an organic compound constituting the hole blocking layer include aluminum complexes such as BAlq, triazole derivatives and phenanthroline derivatives such as BCP. The thickness of the hole blocking layer is preferably from 1 nm to 500 nm, more preferably from 5 nm to 200 nm, and further preferably from 10 nm to 100 nm. The hole blocking layer may be of a single-layered structure composed of one or two or more kinds of the foregoing materials or may be of a multilayered structure composed of plural layers of the same composition or a different composition.

(Passivation Layer)

In the invention, the whole of the organic EL device may be passivated by a passivation layer.

As a material to be contained in the passivation layer, a material having a flattening action and a material having a function to inhibit the matter that moisture and oxygen come into the device are preferable. Specific examples thereof include metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal nitrides such as $SiN_x$; metal oxynitrides such as $SiN_xO_y$; metal fluorides such as $MgF_2$, LiF, $AlF_3$ and $CaF_2$; polyethylene; polypropylene; polymethyl methacrylate; polyimides; polyureas; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers having a cyclic structure in the copolymer principal chain; water-absorbing substances having a coefficient of water absorption of 1% or more; and moisture-proof substances having a coefficient of water absorption of not more than 0.1%. Of these, oxides, nitrides and oxynitrides of a metal are preferable; and oxides, nitrides and oxynitrides of silicon are especially preferable.

The formation method of the passivation layer is not particularly limited, and examples thereof include a vacuum vapor deposition method, a sputtering method, a reactive sputtering method, an MBE (molecular beam epitaxy) method, a cluster ion beam method, an ion plating method, a plasma polymerization method (high-frequency excitation ion plating method), a plasma CVD method, a laser CVD method, a thermal CVD method, a gas source CVD method, a vacuum ultraviolet CVD method, a coating method, a printing method and a transfer method. In the invention, the passivation layer may also be used as a conductive layer.

(Sealing)

Furthermore, in the organic electroluminescent device of the invention, the whole of the device may be sealed by using a sealing container. Also, a moisture absorber or an inert liquid may be enclosed in a space between the sealing container and the light-emitting device. The moisture absorber is not particularly limited. Examples of the moisture absorber which can be used include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite and magnesium oxide. The inert liquid is not particularly limited, and examples thereof include paraffins, liquid paraffins, fluorine based solvents such as perfluoroalkanes, perfluoroamines and perfluoroethers, chlorine based solvents and silicone oils.

As another sealing method, a so-called solid sealing method may be employed, too. The solid sealing method is a method in which after forming the passivation layer on the organic EL device, an adhesive layer and a support layer with barrier properties are superimposed thereon, followed by curing. The adhesive is not particularly limited, and examples thereof include thermosetting epoxy resins and photocurable acrylate resins. The support with barrier properties may be glass or may be the gas barrier film of the invention.

Furthermore, as another sealing method, a so-called film sealing method may be employed, too. The film sealing method is a method in which an alternate laminate of an inorganic layer and an organic layer is provided on the organic EL device. The organic EL device may be covered by the passivation layer prior to providing the alternate laminate.

In the organic electroluminescent device of the invention, the light emission can be obtained by applying a direct current (may contain an alternate current component as the need arises) voltage (usually from 2 volts to 15 volts) or a direct current between the anode and the cathode. As to the driving method of the organic electroluminescent device of the invention, driving methods described in, for example, JP-A-2-148687, JP-A-6-301355, JP-A-5-29080, JP-A-7-134558, JP-A-8-234685, JP-A-8-241047, Japanese Patent No. 2784615 and U.S. Pat. Nos. 5,828,429 and 6,023,308 can be applied.

The characteristic features of the invention are hereunder described in more detail with reference to the following Examples. Materials, use amounts, proportions, treatment contents, treatment procedures and the like shown in the following Examples can be properly changed. Accordingly, the scope of the invention should not be limitedly construed by the following specific examples.

Example 1

Preparation and Evaluation of Gas Barrier Film

Gas barrier films (Samples Nos. 1 to 11) having an inorganic layer and an organic layer provided on a flexible supporting substrate were prepared according to the following procedures. Details of a structure of each of the gas barrier films are described in Table 1. A PEN (Q-65A, manufactured by Teijin DuPont Films Japan Limited) film having a thickness of 100 µm was used as the flexible supporting substrate.

(1) Formation of Inorganic Layer (X)

An inorganic layer was formed by a plasma CVD apparatus. A specific fabrication condition is shown below.

A vacuum chamber of the plasma CVD apparatus was evacuated to an ultimate pressure of $4 \times 10^{-3}$ Pa by an oil-sealed rotary pump and a turbo-molecular pump. Next, argon was introduced as a discharge gas, and a discharge electric power of 500 W was applied from a discharge power source. A silane gas ($SiH_4$) and nitrogen were introduced into the chamber, and the fabrication was carried out for a fixed time while controlling a fabrication pressure at 0.45 Pa, thereby forming an inorganic layer (X) of silicon nitride. The obtained silicon nitride film had a thickness of 100 nm and a film density of 2.86 $g/cm^3$.

(2) Formation of Organic Layer (Y)

9 g of tripropylene glycol diacrylate (TPGDA, manufactured by Daicel-Cytec Company Ltd.) as a photopolymerizable acrylate and 0.1 g of a photopolymerization initiator (IRGACURE 907, manufactured by Ciba Specialty Chemicals) were dissolved in 190 g of methyl ethyl ketone to prepare a coating solution. This coating solution was coated on the flexible supporting substrate using a wire bar and irradiated with ultraviolet rays at an illuminance of 350 $mW/cm^2$ and a dose of 500 $mJ/cm^2$ under purging with nitrogen in an oxygen concentration of not more than 0.1% using an air-cooled metal halide lamp (manufactured by Eye Graphics Co., Ltd.) of 160 W/cm, thereby forming an organic layer (Y). The thickness was about 500 nm.

(3) Formation of Antistatic Layer (A)

The formation of an antistatic layer was carried out by the following method.

[Antistatic Layer (A-1): Invention]

9 g of tripropylene glycol diacrylate (TPGDA, manufactured by Daicel-Cytec Company Ltd.) as a photopolymerizable acrylate, 4 g of zinc diacrylate (ZA, manufactured by Aldrich) and 0.1 g of a photopolymerization initiator (IRGACURE 907, manufactured by Ciba Specialty Chemicals) were suspended in 190 g of a methyl ethyl ketone/methanol mixed solvent (methanol content: 80% by volume) to prepare a coating solution. This coating solution was coated on the flexible supporting substrate using a wire bar and irradiated with ultraviolet rays at a dose of 500 mJ/cm$^2$ under purging with nitrogen in an oxygen concentration of not more than 0.1% using an air-cooled metal halide lamp (manufactured by Eye Graphics Co., Ltd.) of 160 W/cm, thereby forming an antistatic layer (A-1). The thickness was about 1,000 nm, and the surface resistivity was $3\times10^9 \Omega/\square$.

[Antistatic Layer (A-2): Invention]

An antistatic layer (A-2) was formed in the same manner as in the antistatic layer (A-1), except for changing the addition amount of zinc diacrylate of the antistatic layer (A-1) to 2 g. The thickness was about 800 nm, and the surface resistivity was $6\times10^{10} \Omega/\square$.

[Antistatic Layer (A-3): Invention]

An antistatic layer (A-3) was formed in the same manner as in the antistatic layer (A-1), except for changing the zinc diacrylate of the antistatic layer (A-1) to zinc dimethacrylate (SR-9016, manufactured by Sartomer Company). The thickness was about 900 nm, and the surface resistivity was $9\times10^9 \Omega/\square$.

[Antistatic Layer (A-4): Invention]

An antistatic layer (A-4) was formed in the same manner as in the antistatic layer (A-1), except for changing the zinc diacrylate of the antistatic layer (A-1) to 1 g of a zinc acrylate oligomer (CN-2404, manufactured by Sartomer Company). The thickness was about 900 nm, and the surface resistivity was $3\times10^9 \Omega/\square$.

[Antistatic Layer (A-5): Invention]

An antistatic layer (A-5) was formed in the same manner as in the antistatic layer (A-1), except for changing the zinc diacrylate of the antistatic layer (A-1) to 1 g of a zinc acrylate oligomer (CN-2405, manufactured by Sartomer Company). The thickness was about 900 nm, and the surface resistivity was $4\times10^9 \Omega/\square$.

[Antistatic Layer (A-6): Comparison]

A water-dispersed coating material TWU-1 (manufactured by Mitsubishi Materials Corporation) composed of an antimony-containing tin oxide fine particle and an acrylic resin was coated on the flexible supporting substrate using a bar coater and irradiated with ultraviolet rays at a dose of 150 mJ/cm$^2$ under purging with nitrogen in an oxygen concentration of not more than 0.1% using an air-cooled metal halide lamp (manufactured by Eye Graphics Co., Ltd.) of 160 W/cm, thereby forming an antistatic layer (A-6). The thickness was about 1,000 nm, and the surface resistivity was $3\times10^8 \Omega/\square$.

[Antistatic Layer (A-7): Comparison]

According to the description of Example 1 of JP-A-8-294991, a coating solution (solids content: 0.5% by mass) prepared by mixing an N-(β-aminoethyl)-γ-amino-propyl-methoxysilane aqueous solution, a dispersion of a conductive metal particle (aluminum dispersed aqueous solution formed by refluxing aluminum(III) chloride hexahydrate, polyvinyl alcohol, ethanol and water) and a water dispersible acrylic resin was coated on the substrate film by a bar coater and further subjected to a thermal treatment at 200 to 230° C. for 4.0 seconds, thereby forming an antistatic layer (A-7). The thickness was about 200 nm, and the surface resistivity was $1\times10^8 \Omega/\square$.

(4) Preparation of Gas Barrier Film

A gas barrier film was prepared by successively forming the foregoing inorganic layer and organic layer on the flexible supporting substrate having an antistatic layer previously formed thereon according to the configuration of each sample described in Table 1.

(5) Evaluation of Physical Properties of Gas Barrier Film

Various physical properties of each of the gas barrier films were evaluated using the following apparatuses.

[Layer Configuration (Thickness)]

The thickness was measured through observation of an ultra-thin section of the film sample by a scanning electron microscope (S-900 Model, manufactured by Hitachi, Ltd.).

[Water Vapor Permeability (g/m$^2$/Day)]

The water vapor permeability was measured using MOCON's PERMATRAN-W3/31 (condition: at 40° C. and at a relative humidity of 90%). Also, values of not more than 0.01 g/m$^2$/day as a measurement limit of the foregoing MOCON's apparatus were complemented employing the following method. First of all, metallic Ca was vapor deposited directly on the gas barrier film, and the film and a glass substrate were sealed with a commercially available sealing medium for organic EL such that the vapor deposited Ca was faced inward, thereby preparing a measurement sample. Next, the measurement sample was kept under the foregoing temperature and relative humidity condition, and the water vapor permeability was determined from a change of optical density (lowering of metallic luster by hydroxylation or oxidation) of metallic Ca on the gas barrier film.

[Surface Resistivity]

After allowing the flexible supporting substrate having only an antistatic layer coated thereon to stand in an atmosphere at 25° C. and at a relative humidity of 60% for 24 hours, the surface resistivity was measured under the same circumstance.

[Measurement of X-Ray Reflectance]

The X-ray reflectance was measured using a sample for evaluation having been fabricated on an Si wafer and using ATX-G, manufactured Rigaku Denki Co., Ltd. A film density of the thin film was calculated from the measurement results.

TABLE 1

| | Antistatic Layer | | | |
|---|---|---|---|---|
| Sample No. | Configuration | Kind | Surface Resistivity ($\Omega/\square$) | Water Vapor Permeability (g/m$^2$/day) |
| 1 (Inv.) | A-1/PEN/Y/X | A-1 | $3 \times 10^9$ | 0.01 |
| 2 (Inv.) | A-2/PEN/Y/X | A-2 | $6 \times 10^{10}$ | 0.07 |
| 3 (Inv.) | A-3/PEN/Y/X | A-3 | $9 \times 10^9$ | 0.04 |
| 4 (Inv.) | A-4/PEN/Y/X | A-4 | $3 \times 10^9$ | 0.01 |
| 5 (Inv.) | A-5/PEN/Y/X | A-5 | $4 \times 10^9$ | 0.01 |
| 6 (Inv.) | PEN/A-1/Y/X | A-1 | $3 \times 10^9$ | 0.07 |
| 7 (Com.) | PEN/Y/X | Nil | — | 0.2 |
| 8 (Com.) | A-6/PEN/Y/X | A-6 | $3 \times 10^8$ | 0.08 |
| 9 (Com.) | A-7/PEN/Y/X | A-7 | $1 \times 10^8$ | 0.5 |
| 10 (Inv.) | A-4/PEN/Y/X/Y/X | A-4 | $3 \times 10^9$ | 0.005 |
| 11 (Com.) | A-6/PEN/Y/X/Y/X | A-6 | $3 \times 10^8$ | 0.04 |
| 12 (Inv.) | A-1/PEN/X | A-1 | $3 \times 10^9$ | 0.1 |
| 13 (Com.) | A-6/PEN/X | A-6 | $3 \times 10^8$ | 0.5 |

"Inv.": Invention
"Comp.": Comparison

It is noted from Table 1 that the gas barrier films having an antistatic layer provided thereon according to the invention are more excellent than the conventional gas barrier films having an antistatic layer provided thereon (see Samples Nos. 1 to 5, 8 to 11 and 12 to 13). Also, the smaller the surface resistivity value of the antistatic layer, the smaller the water vapor permeability is, and such is effective (see Samples Nos. 1 to 5). In particular, it is noted that in the case where plural inorganic layers and organic layers are provided, the effect of the invention is larger (see Samples Nos. 4 and 10). Furthermore, it is noted that in the invention, even where the antistatic layer is formed on any surface of the flexible support, an excellent effect is obtained (see Samples Nos. 1 to 6, 10 and 12). Also, the samples of the invention (Samples Nos. 1 to 6, 10 and 12) were satisfactory in smoothness of the surface as compared with the samples using a conductive fine particle (see Samples Nos. 8, 9, 11 and 13).

Example 2

Preparation and Evaluation of Organic El Device (1) Preparation of Organic EL Device A conductive glass substrate having an ITO film (surface resistivity value: 10Ω/□) was rinsed with 2-propanol and then subjected to a UV-ozone treatment for 10 minutes. The following organic compound layers were successively vapor deposited on this substrate (anode) by a vacuum vapor deposition method.

(First Hole Transport Layer)

Copper phthalocyanine: thickness, 10 nm (Second Hole Transport Layer)

N,N'-Diphenyl-N,N'-dinaphthylbenzidine: thickness, 40 nm (Light-Emitting Layer/Electron Transport Layer)

Tris(8-hydroxyquinolinato)aluminum: thickness, 60 nm

Finally, 1 nm of lithium fluoride and 100 nm of metallic aluminum were successively vapor deposited to form a cathode, onto which was then applied a silicon nitride film having a thickness of 5 μm by a plane-parallel plate CVD method, thereby preparing an organic EL device.

(2) Installment of Gas Barrier Layer on Organic EL Device

Each of the barrier films prepared in Example 1 (Samples Nos. 1, 7, 10 and 11) was stuck on the organic EL device using a thermosetting type adhesive (EPO-TEK 310, manufactured by Daizo Nichimoly Co., Ltd.) and heated at 65° C. for 3 hours to cure the adhesive. Every twenty devices of the thus sealed organic EL devices (Samples Nos. 14 to 17) were prepared.

(3) Evaluation of Luminous Surface Properties of Organic EL Device

Each of the organic EL devices (Samples Nos. 14 to 17) immediately after the preparation was light emitted upon application with a voltage of 7 V using a source measure unit (SMU 2400 Model, manufactured by Keithley Instruments Inc.). The luminous surface properties were microscopically observed. As a result, it was confirmed that all of the devices gave uniform light emission free from a dark spot.

Next, each of the devices was allowed to stand in a dark room at 60° C. and at a relative humidity of 90% for 24 hours and then observed as to luminous surface properties. A rating of devices in which a dark spot having a diameter of larger than 300 μm was observed was defined as a fault rating. The fault rating of each of the devices was shown in Table 2.

TABLE 2

| Sample No. | Sample No. of Gas Barrier Film | Fault Rating (%) | Remark |
|---|---|---|---|
| 14 | 1 | 5 | Invention |
| 15 | 7 | 40 | Comparison |
| 16 | 10 | 0 | Invention |
| 17 | 11 | 22 | Comparison |

It is noted from Table 2 that the organic EL device sealed using the barrier film according to the invention is excellent in wet heat durability. Also, it is noted that the gas barrier film provided with a gas barrier layer composed of two or more organic layers and two or more inorganic layers according to the invention is much low in fault rating in an organic EL-mounted system and is especially preferable.

INDUSTRIAL APPLICABILITY

The gas barrier film of the invention is a flexible gas barrier film having high barrier properties and capable of being transparent. For that reason, the gas barrier film of the invention can be widely utilized in the situation requiring high barrier properties and flexibility. In particular, by using the gas barrier film of the invention, it is possible to manufacture an organic device with excellent wet heat durability, and therefore, the invention is high in industrial applicability.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 154373/2007 filed on Jun. 11, 2007 and Japanese Patent Application No. 106853/2008 filed on Apr. 16, 2008, which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A gas barrier film comprising an antistatic layer and a gas barrier layer on a flexible supporting substrate, wherein the gas barrier layer comprises at least one inorganic layer, and the antistatic layer comprises an acrylic or methacrylic resin obtained by copolymerizing a monomer represented by the following formula (1) or an oligomer thereof:

$$(Ac^1-L^1)_m-M-(L^2-Ac^2)_n \qquad \text{Formula (1)}$$

wherein $Ac^1$ and $Ac^2$ each independently represents an acryloyl group or a methacryloyl group; $L^1$ and $L^2$ each independently represents a substituted or unsubstituted alkylene group having from 1 to 18 carbon atoms, a substituted or unsubstituted arylene having from 6 to 18 carbon atoms, an ether group, an imino group, a carbonyl group or a divalent connecting group in which two or more of these groups are bonded in series; M represents a metal atom; m and n each independently represents an integer of from 0 to 6; and the total sum of m and n is from 1 to 6.

2. The gas barrier film according to claim 1, wherein the antistatic layer comprises an acrylic or methacrylic resin obtained by copolymerizing a monomer represented by the formula (1) or an oligomer thereof in an amount of from 1 to 80% by weight relative to the other acrylate or methacrylate monomer.

3. The gas barrier film according to claim 1, wherein M in the formula (1) is a zinc atom, an aluminum atom, an indium atom or a tin atom.

4. The gas barrier film according to claim 1, wherein the antistatic layer has a surface resistivity of not more than $1 \times 10^{11}$ Ω/□ in an atmosphere at 25° C. and at a relative humidity of 60%.

5. The gas barrier film according to claim 1, wherein the antistatic layer has a thickness of from 0.2 to 5 μm.

6. The gas barrier film according to claim 1, further comprising at least one organic layer.

7. The gas barrier film according to claim 6, wherein the organic layer comprises, as a major component, a polymer obtained from an acrylate monomer, a methacrylate monomer or a mixture thereof.

8. An organic device comprising the gas barrier film of claim 1.

9. The organic device according to claim 8 wherein the gas barrier film is used as a sealing film.

10. The organic device according to claim 8 wherein the organic device is an organic electroluminescent device.

* * * * *

UNITED STATES PATENT AND TRADEMARK OFFICE
CERTIFICATE OF CORRECTION

PATENT NO. : 8,101,288 B2  
APPLICATION NO. : 12/136430  
DATED : January 24, 2012  
INVENTOR(S) : Satoshi Aiba et al.

It is certified that error appears in the above-identified patent and that said Letters Patent is hereby corrected as shown below:

ON THE TITLE PAGE:

Correct item (75) to read as follows:

-- (75) Inventors: Satoshi Aiba, Kanagawa (JP); Yuya Agata, Kanagawa (JP) --.

Correct item (73) to read as follows:

-- (73) Assignee: FUJIFILM Corporation, Tokyo (JP) --.

Signed and Sealed this  
Eighth Day of May, 2012

David J. Kappos  
*Director of the United States Patent and Trademark Office*